(12) United States Patent
Chen et al.

(10) Patent No.: US 11,056,427 B2
(45) Date of Patent: Jul. 6, 2021

(54) CHIP PACKAGE

(71) Applicant: XINTEC INC., Taoyuan (TW)

(72) Inventors: Kuei-Wei Chen, Taoyuan (TW); Chia-Ming Cheng, New Taipei (TW)

(73) Assignee: XINTEC INC., Taoyuan (TW)

( * ) Notice: Subject to any disclaimer, the term of this patent is extended or adjusted under 35 U.S.C. 154(b) by 35 days.

(21) Appl. No.: 16/576,714

(22) Filed: Sep. 19, 2019

(65) Prior Publication Data

US 2020/0111737 A1 Apr. 9, 2020

(30) Foreign Application Priority Data

Oct. 8, 2018 (CN) .......................... 201811169457.X

(51) Int. Cl.
*H01L 23/522* (2006.01)
*H01L 23/48* (2006.01)

(52) U.S. Cl.
CPC ........ *H01L 23/5226* (2013.01); *H01L 23/481* (2013.01)

(58) Field of Classification Search
CPC ............... H01L 23/5226; H01L 23/481; H01L 21/76898; H01L 23/562; H01L 23/585; H01L 23/5223; H01L 28/87; H01L 28/91; H01L 24/05; H01L 24/48; H01L 21/76807; H01L 24/03; H01L 23/528; H01L 23/544; H01L 25/0657; H01L 23/535; H01L 27/0292; H01L 28/40; H01L 23/60; H01L 29/06017; H01L 27/0255; H01L 23/48; H01L 23/5222; H01L 27/0629; G11C 11/407

USPC .............. 257/620, 534, 774, 773, 777, 532, 257/E21.536, E23.194, E23.011, E29.001; 438/462, 396; 361/301.4
See application file for complete search history.

(56) References Cited

U.S. PATENT DOCUMENTS

| | | | |
|---|---|---|---|
| 2001/0006256 A1 | 7/2001 | Nakashima | |
| 2008/0128859 A1* | 6/2008 | Chen | H01L 23/5223 257/534 |
| 2009/0201625 A1* | 8/2009 | Liao | H01L 23/5223 361/301.4 |
| 2012/0267776 A1 | 10/2012 | Nin | |

(Continued)

FOREIGN PATENT DOCUMENTS

| | | |
|---|---|---|
| CN | 102751261 | 10/2012 |
| CN | 102891120 | 1/2013 |

*Primary Examiner* — Mouloucoulaye Inoussa
(74) *Attorney, Agent, or Firm* — Liu & Liu

(57) ABSTRACT

A chip package includes a substrate, first and second dielectric layers, first and second metal layers, and first conductive vias. The first dielectric layer is on a bottom surface of the substrate. The first metal layer is on a bottom surface of the first dielectric layer. The first metal layer has first sections, and every two adjacent first sections have a gap therebetween. The second dielectric layer is on a bottom surface of the first metal layer and the bottom surface of the first dielectric layer. The second metal layer is on a bottom surface of the second dielectric layer, and has second sections respectively aligned with the gaps. Two sides of the second section respectively overlap two adjacent first sections. The first conductive via is in the second dielectric layer and in electrical contact with the first and second sections.

16 Claims, 8 Drawing Sheets

(56) References Cited

U.S. PATENT DOCUMENTS

2012/0319757 A1* 12/2012 Sato .................. H01L 23/481
327/419
2013/0328187 A1    12/2013 Ono et al.
2015/0364425 A1    12/2015 Lee et al.

* cited by examiner

CHIP PACKAGE

RELATED APPLICATIONS

This application claims priority to China Application Serial Number 201811169457.X, filed Oct. 8, 2018, which is herein incorporated by reference.

BACKGROUND

Field of Invention

The present invention relates to a chip package.

Description of Related Art

In general, a chip package has plural metal layers and plural dielectric layers. Extending directions of one of the metal layers and an underlying metal layer intersect with each other. For example, the extending directions of the two upper and lower metal layers are perpendicular to each other. The upper metal layer is electrically connected to the lower metal layer by a pillar-shaped conductive via, in which the pillar-shaped conductive via is located in an intersection position between the upper and lower metal layers, and thus the upper and lower metal layers show a mesh shape. In such a configuration, during manufacture of a through silicon via (TSV) in a chip package, the topmost dielectric layer in a through hole of a substrate would be etched to expose the topmost metal layer, and a redistribution layer is then formed to be in electrical contact with the topmost metal layer. As a result, a contact area between the redistribution layer and the metal layer is difficult to be increased, so the redistribution layer is easily separated from the metal layer. Moreover, when the topmost metal layer in the through hole is etched, other underlying dielectric layers may suffer the aforesaid etch step to form a recess, such that the subsequently formed redistribution layer would be in the recess, which results in a bending angle to be too large and easily break.

SUMMARY

An aspect of the present invention is to provide a chip package.

According to an embodiment of the present invention, a chip package includes a substrate, a first dielectric layer, a first metal layer, a second dielectric layer, a second metal layer, and a plurality of first conductive vias. The first dielectric layer is located on a lower surface of the substrate. The first metal layer is located on a lower surface of the first dielectric layer and has a plurality of first sections. Every two adjacent first sections have a gap therebetween. The second dielectric layer is located on a lower surface of the first metal layer and the lower surface of the first dielectric layer. The second metal layer is located on a lower surface of the second dielectric layer and has a plurality of second sections, the second sections are respectively aligned with the gaps, and two sides of each of the second sections respectively overlap two adjacent first sections. The first conductive vias are located in the second dielectric layer, and each of the first conductive vias is in electrical contact with one of the first sections and one of the second sections.

In one embodiment of the present invention, a width of the second sections is greater than a width of the gaps.

In one embodiment of the present invention, the first sections, the second sections, and the first conductive vias extend along a same direction.

In one embodiment of the present invention, the first sections are parallel to the second sections.

In one embodiment of the present invention, the substrate has a through hole that has no first dielectric layer therein, and the first sections are located in the through hole.

In one embodiment of the present invention, the chip package further includes a redistribution layer. The redistribution layer is located on an upper surface of the substrate, a wall surface of the through hole, and the first sections in the through hole.

In one embodiment of the present invention, the through hole has no second dielectric layer therein, the second sections are located in the through hole, and the redistribution layer extends onto the second sections in the through hole.

In one embodiment of the present invention, the chip package further includes a third dielectric layer. The third dielectric layer is located on a lower surface of the second metal layer and the lower surface of the second dielectric layer.

In one embodiment of the present invention, the chip package further includes a third metal layer. The third metal layer is located on a lower surface of the third dielectric layer and has a plurality of third sections. The third sections are respectively aligned with the first sections, and two sides of each of the third sections respectively overlap two adjacent second sections.

In one embodiment of the present invention, the chip package further includes a plurality of second conductive vias. The second conductive vias are located in the third dielectric layer, and each of the second conductive vias is in electrical contact with one of the second sections and one of the third sections.

In one embodiment of the present invention, the chip package further includes a fourth dielectric layer. The fourth dielectric layer is located on a lower surface of the third metal layer and the lower surface of the third dielectric layer.

In one embodiment of the present invention, the chip package further includes a fourth metal layer. The fourth metal layer is located on a lower surface of the fourth dielectric layer and has a plurality of fourth sections. The fourth sections are respectively aligned with the second sections, and two sides of each of the fourth sections respectively overlap two adjacent third sections.

In one embodiment of the present invention, the chip package further includes a plurality of third conductive vias. The third conductive vias are located in the fourth dielectric layer, and each of the third conductive vias is in electrical contact with one of the third sections and one of the fourth sections.

In one embodiment of the present invention, a width of the fourth sections is the same as a width of the second sections.

In one embodiment of the present invention, the chip package further includes a fifth dielectric layer. The fifth dielectric layer is located on a lower surface of the fourth metal layer and the lower surface of the fourth dielectric layer.

In one embodiment of the present invention, a width of the third sections is the same as a width of the first sections.

In the aforementioned embodiments of the present invention, since the second sections of the second metal layer are respectively aligned with the gaps between every two adjacent first sections of the first metal layer, the first sections of the first metal layer and the second sections of the second metal layer may be referred to as a staggered arrangement. Furthermore, two sides of each of the second sections respectively overlap two adjacent first sections, and thus the first conductive vias in the second dielectric layer can be in electrical contact with the overlapping first and second sections. Through the aforesaid configuration, during manufacture of a through silicon via (TSV) in the chip package, a through hole can be formed in the substrate and an etch process is performed on the first and second dielectric layers, and a redistribution layer is then formed to be in electrical contact with the first and second sections. As a result, a contact area between the redistribution layer and the metal layers is increased, thereby improving the yield of products. Moreover, the second sections of the second metal layer may serve as an etch stop layer of the aforesaid etch step to prevent other underlying dielectric layers from suffering the aforesaid etch step to form a recess. Therefore, a bending angle of the subsequently formed redistribution layer can be prevented from being too large to break.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
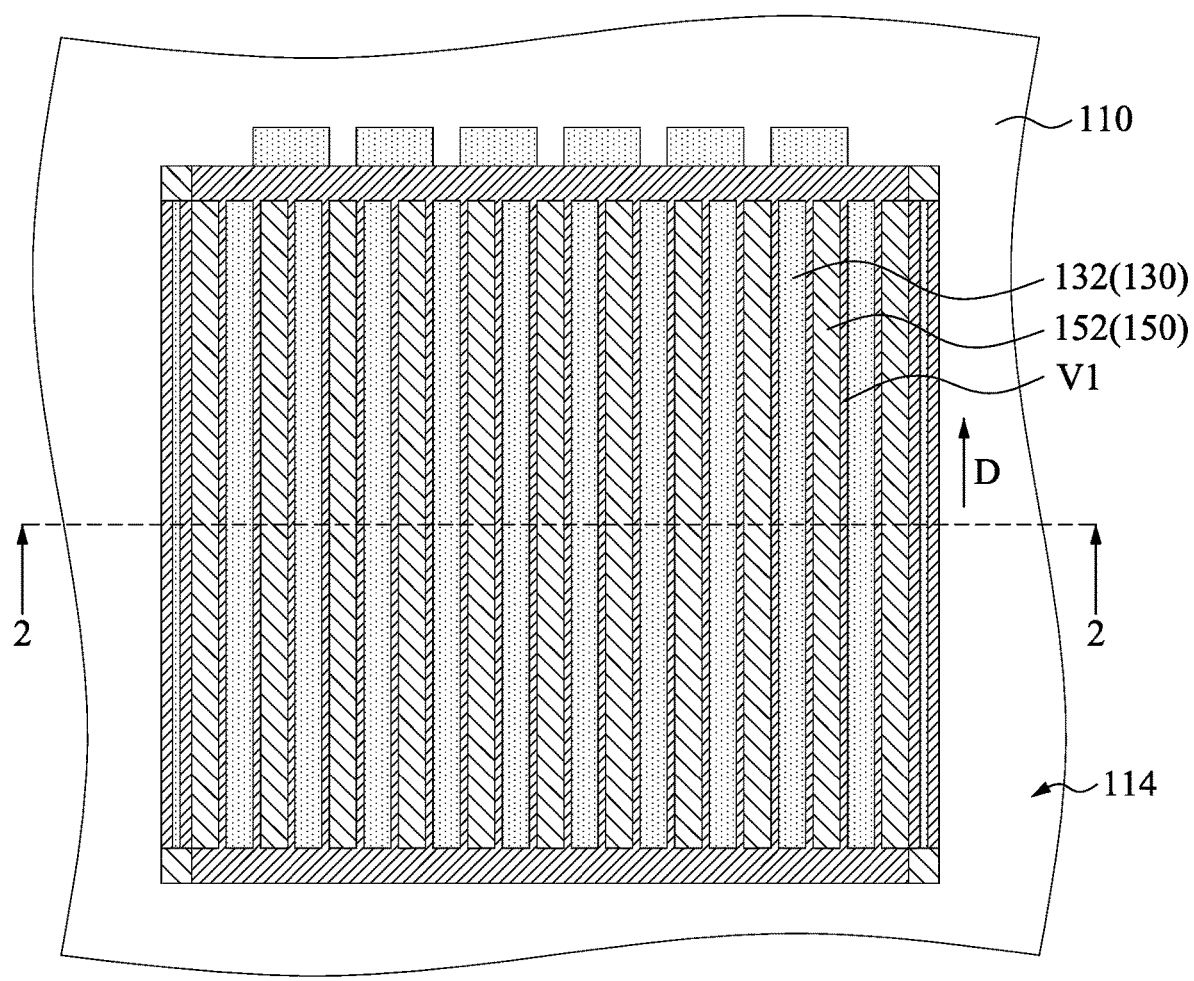
FIG. 1 is a top view of a chip package according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
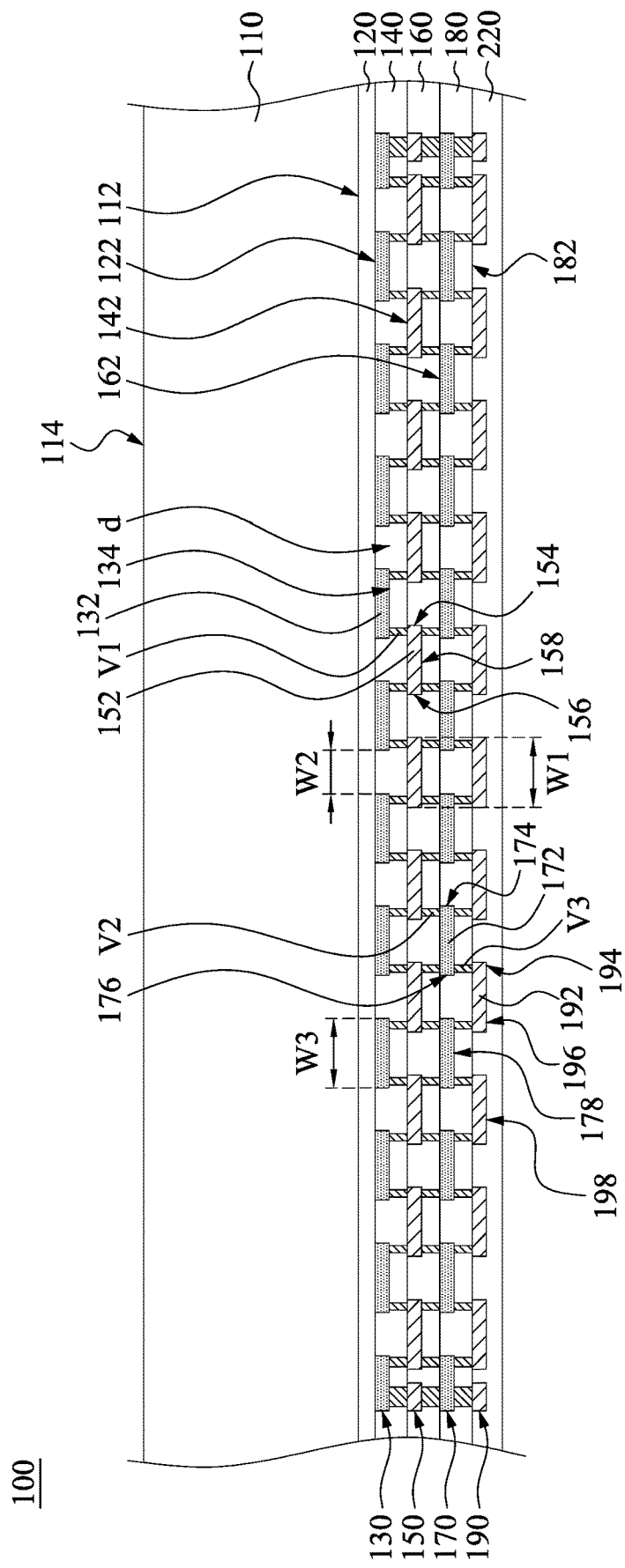
FIG. 2 is a cross-sectional view of the chip package taken along line 2-2 of FIG. 1.

FIG. 1 is a top view of a chip package 100 according to one embodiment of the present invention. FIG. 2 is a cross-sectional view of the chip package 100 taken along line 2-2 of FIG. 1. As shown in FIG. 1 and FIG. 2, the chip package 100 includes a substrate 110, a first dielectric layer 120, a first metal layer 130, a second dielectric layer 140, a second metal layer 150, and a plurality of first conductive vias V1. In order to make FIG. 1 more clear for conveniently explanation, the first metal layer 130, the second metal layer 150, and the first conductive vias V1 below the substrate 110 are shown by solid lines, and the first conductive vias V1 are illustrated in FIG. 1. The substrate 110 may be made of a material including silicon, such as a silicon substrate. The first dielectric layer 120 is located on a lower surface 112 of the substrate 110. The first metal layer 130 is located on a lower surface 122 of the first dielectric layer 120. The first metal layer 130 has a plurality of first sections 132, and every two adjacent first sections 132 have a gap d therebetween. The second dielectric layer 140 is located on a lower surface 134 of the first metal layer 130 and the lower surface 122 of the first dielectric layer 120. The second metal layer 150 is located on a lower surface 142 of the second dielectric layer 140. The second metal layer 150 has a plurality of second sections 152, and the second sections 152 are respectively substantially aligned with the gaps d, and thus the first sections 132 of the first metal layer 130 and the second sections 152 of the second metal layer 150 may be referred to as a staggered arrangement. Two sides 154 and 156 of each of the second sections 152 respectively overlap two adjacent first sections 132. In other words, a width W1 of the second section 152 is greater than a width W2 of the gap d.

Moreover, the first conductive vias V1 are located in the second dielectric layer 140, and each of the first conductive vias V1 is in electrical contact with one of the first sections 132 and one of the second sections 152. In this embodiment, top surfaces of the first conductive vias V1 are in electrical contact with the first sections 132, and bottom surfaces of the first conductive vias V1 are in electrical contact with the second sections 152. That is, the first conductive via V1 is in an overlapping area between the first section 132 and the second section 152, and is covered by the first section 132.

Through the aforesaid configuration, since the two sides 154 and 156 of the second section 152 respectively overlap two adjacent first sections 132, and thus the first conductive vias V1 in the second dielectric layer 140 can be in electrical contact with the overlapping first and second sections 132 and 152, such that the first sections 132 can be electrically connected to the second sections 152 through the first conductive vias V1. As a result, during manufacture of a through silicon via (TSV) in the chip package 100, a through hole can be formed in the substrate 110 and an etch process is performed on the first and second dielectric layers 120 and 140, and a redistribution layer is then formed to be in electrical contact with the first and second sections 132 and 152, and thus a contact area between the redistribution layer and the metal layers (i.e., the first and second metal layers 130 and 150) is increased to improve the stability of the redistribution layer, thereby improving the yield of products. In addition, the second sections 152 of the second metal layer 150 may serve as an etch stop layer of the aforesaid etch step to prevent other underlying dielectric layers from suffering the aforesaid etch step to form a recess. Therefore, a bending angle of the subsequently formed redistribution layer can be prevented from being too large to break.

Figure 3:
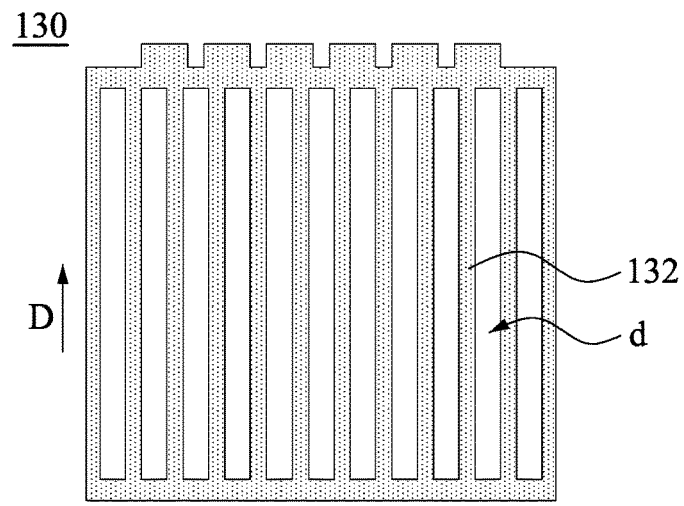
FIG. 3 is a top view of a first metal layer of FIG. 1.
Figure 4:
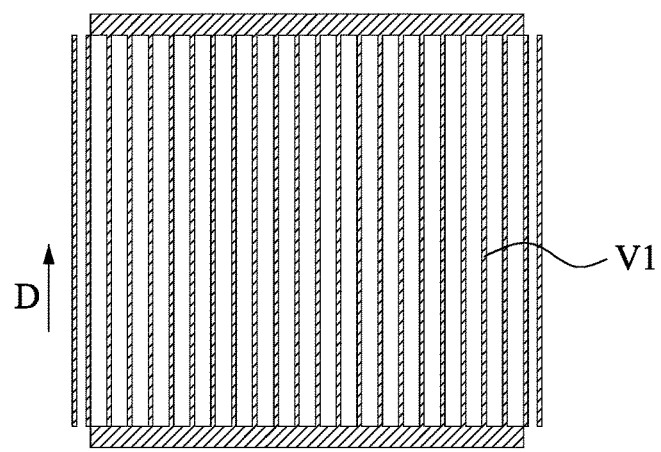
FIG. 4 is a top view of a first conductive via of FIG. 1.
Figure 5:
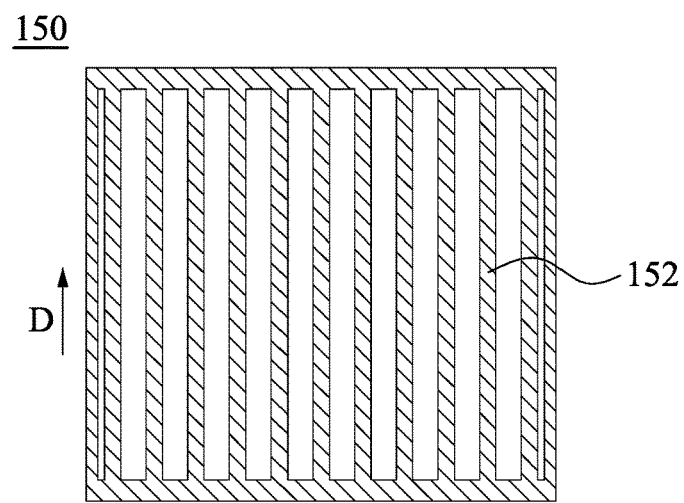
FIG. 5 is a top view of a second metal layer of FIG. 1.

FIG. 3 is a top view of the first metal layer 130 of FIG. 1. FIG. 4 is a top view of the first conductive via V1 of FIG. 1. FIG. 5 is a top view of the second metal layer 150 of FIG. 1. As shown in FIGS. 1 to 5, after the first metal layer 130, the first conductive via V1, and the second metal layer 150 are stacked, the first conductive vias V1 is between the first metal layer 130 and the second metal layer 150. In other words, the first conductive vias V1 are between the first sections 132 and the second sections 152. Positions of the second sections 152 of the second metal layer 150 correspond to positions of the gaps of the first metal layer 130. Moreover, the first sections 132 are substantially parallel to the second sections 152. The first sections 132, the second sections 152, and the first conductive vias V1 extend along the same direction D.

As shown in FIG. 2, in this embodiment, the chip package 100 further includes a third dielectric layer 160, a third metal layer 170, and a plurality of second conductive vias V2. The third dielectric layer 160 is located on a lower surface 158 of the second metal layer 150 and the lower surface 142 of the second dielectric layer 140. The third metal layer 170 is located on a lower surface 162 of the third dielectric layer 160 and has a plurality of third sections 172. The third sections 172 are respectively aligned with the first sections 132, and two sides 174 and 176 of each of the third sections 172 respectively overlap two adjacent second sections 152. The second conductive vias V2 are located in the third dielectric layer 160, and each of the second conductive vias V2 is in electrical contact with one of the second sections 152 and one of the third sections 172. In this embodiment, a width of the third section 172 is substantially the same as a width of the first section 132, both are W3.

In addition, in this embodiment, the chip package 100 further includes a fourth dielectric layer 180, a fourth metal layer 190, a plurality of third conductive vias V3, and a fifth dielectric layer 220. The fourth dielectric layer 180 is located on a lower surface 178 of the third metal layer 170 and the lower surface 162 of the third dielectric layer 160. The fourth metal layer 190 is located on a lower surface 182 of the fourth dielectric layer 180 and has a plurality of fourth sections 192. The fourth sections 192 are respectively aligned with the second sections 152, and two sides 194 and 196 of each of the fourth sections 192 respectively overlap two adjacent third sections 172. The third conductive vias V3 are located in the fourth dielectric layer 180, and each of the third conductive vias V3 is in electrical contact with one of the third sections 172 and one of the fourth sections 192. In this embodiment, a width of the fourth section 192 is substantially the same as a width of the second section 152, both are W1. The fifth dielectric layer 220 is located on a lower surface 192 of the fourth metal layer 190 and the lower surface 182 of the fourth dielectric layer 180.

In this embodiment, the structure of the third metal layer 170 is similar to the structure of the first metal layer 130, the structure of the fourth metal layer 190 is similar to the structure of the second metal layer 150, and each of the structures of the second and third conductive vias V2 and V3 is similar to the structure of the first conductive via V1.

It is noted that the connection relationships and advantages of the elements described above will not be repeated. In the following description, other types of chip packages will be described.

Figure 6:
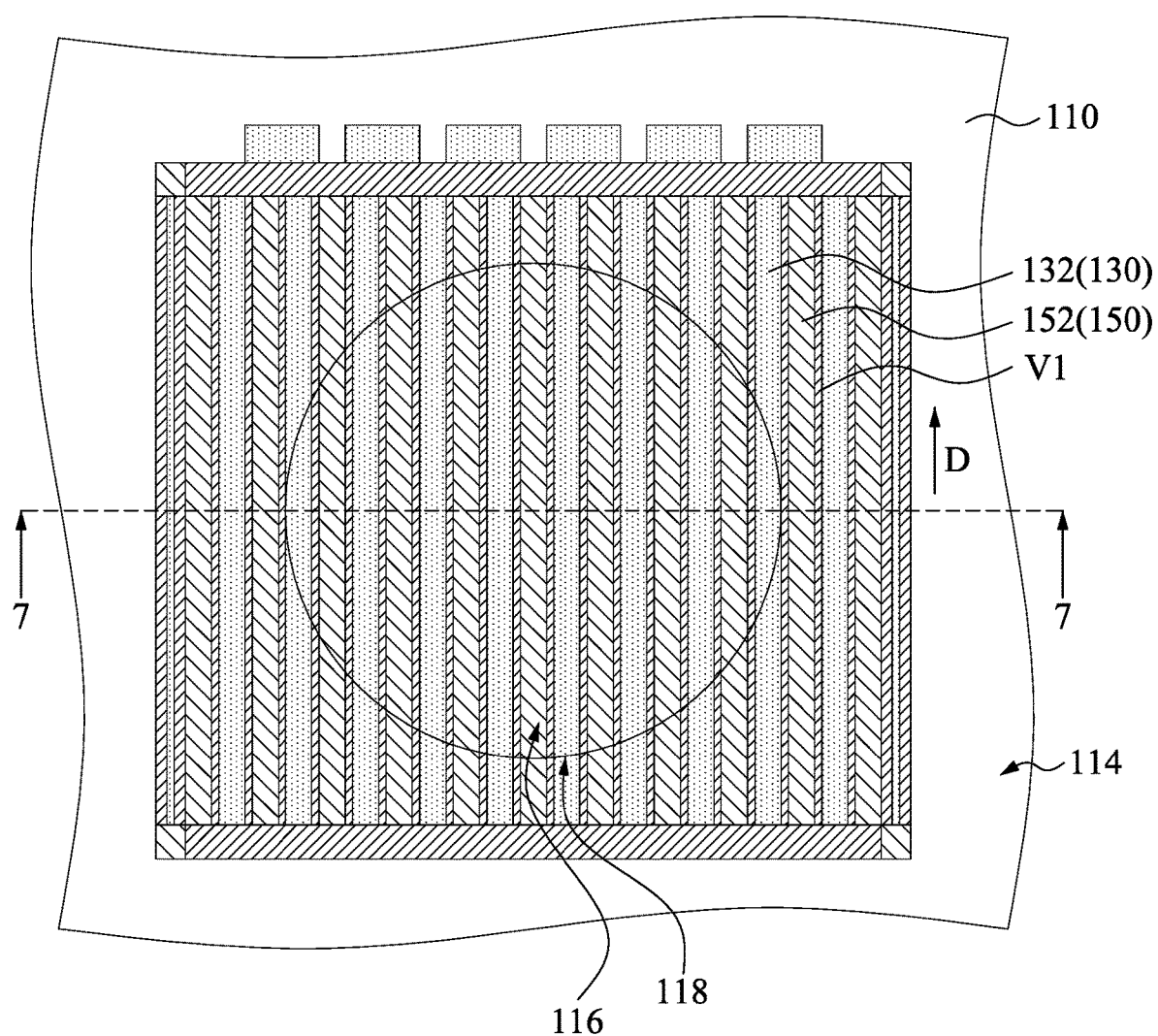
FIG. 6 is a top view of a chip package according to one embodiment of the present invention.
Figure 7:
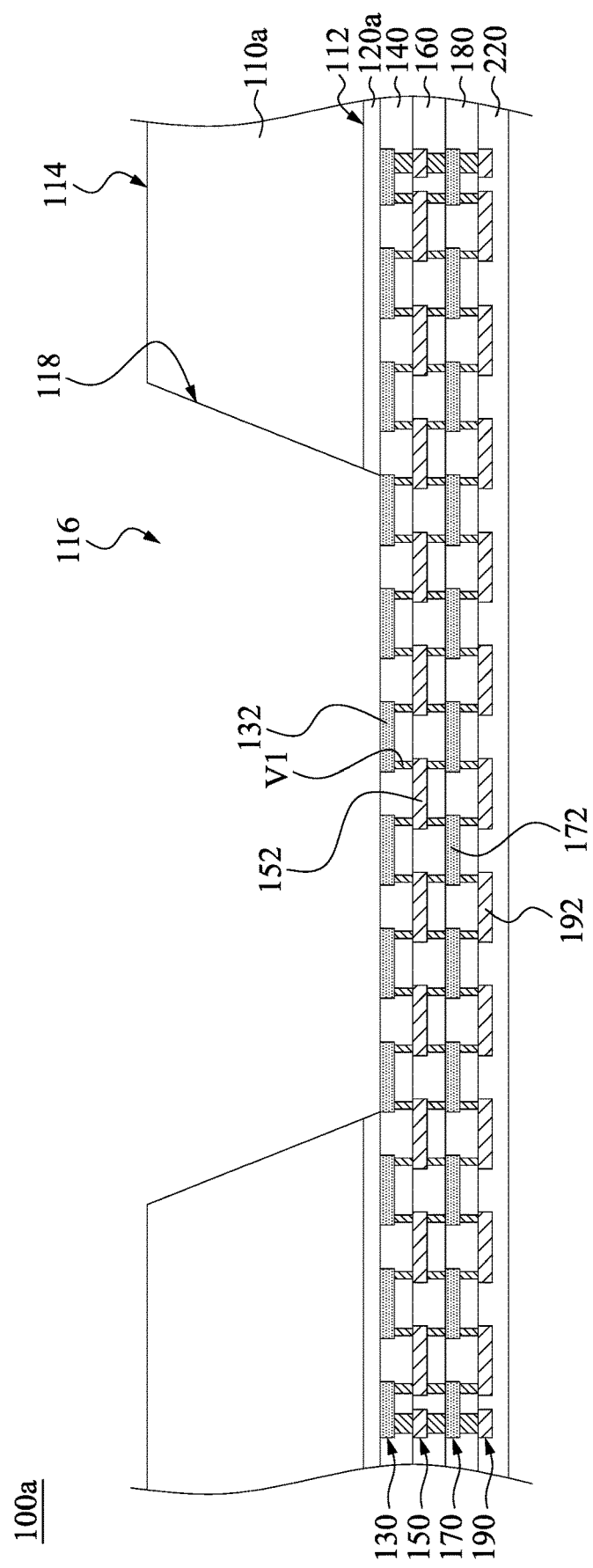
FIG. 7 is a cross-sectional view of the chip package taken along line 7-7 of FIG. 6.

FIG. 6 is a top view of a chip package 100a according to one embodiment of the present invention. FIG. 7 is a cross-sectional view of the chip package 100a taken along line 7-7 of FIG. 6. As shown in FIG. 6 and FIG. 7, the chip package 100a includes a substrate 110a, a first dielectric layer 120a, the first metal layer 130, the second dielectric layer 140, the second metal layer 150, and the first conductive vias V1. The difference between this embodiment and the embodiment shown in FIG. 2 is that the substrate 110a has a through hole 116 that has no first dielectric layer 120a therein, and the first sections 132 of the first metal layer 130 are located in the through hole 116 to be exposed. The structure of the chip package 100a of FIG. 7 may be formed by etching the substrate 110 and the first dielectric layer 120 of FIG. 2.

Figure 8:
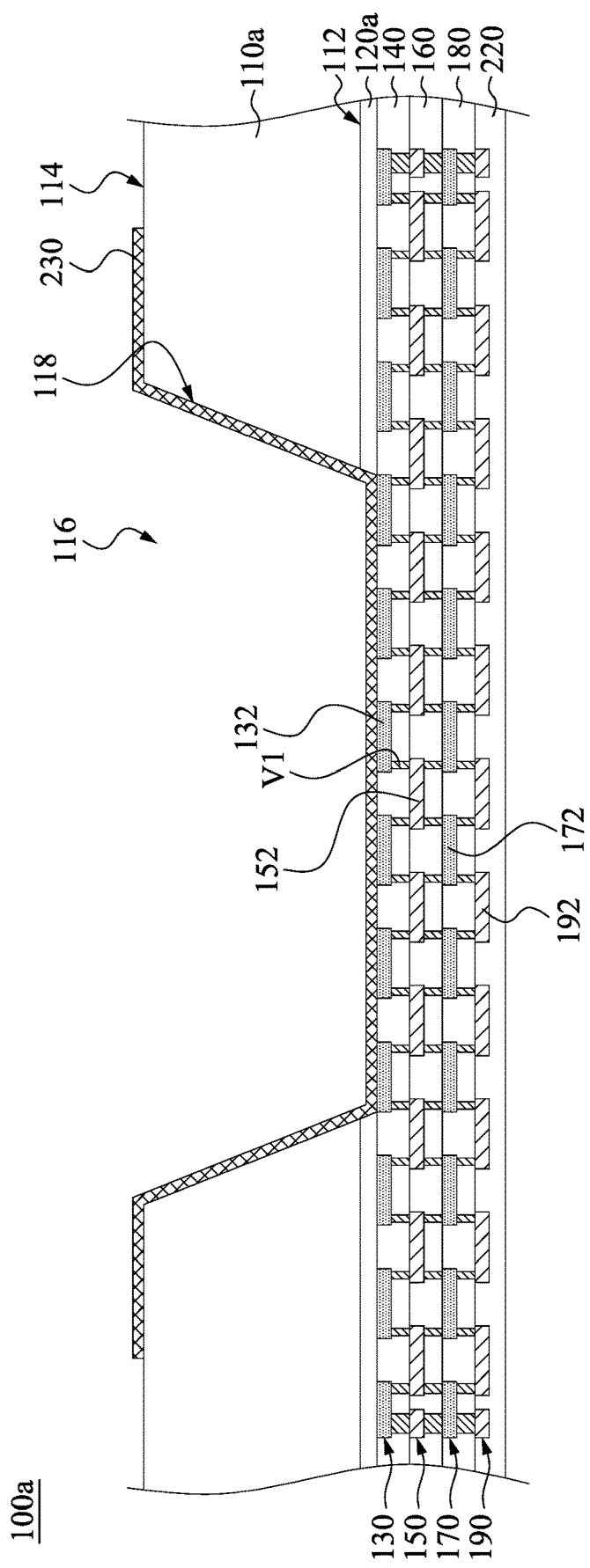
FIG. 8 is a cross-sectional view of the chip package of FIG. 7 after forming a redistribution layer.

FIG. 8 is a cross-sectional view of the chip package 100a of FIG. 7 after forming a redistribution layer 230. The chip package 100a further includes a redistribution layer 230. The redistribution layer 230 is located on an upper surface 114 of the substrate 110a, a wall surface 118 of the through hole 116, and the first sections 132 in the through hole 116. Therefore, through the first sections 132 of the first metal layer 130, the redistribution layer 230 can be electrically connected to other metal layers, such as the second metal layer 150.

Figure 9:
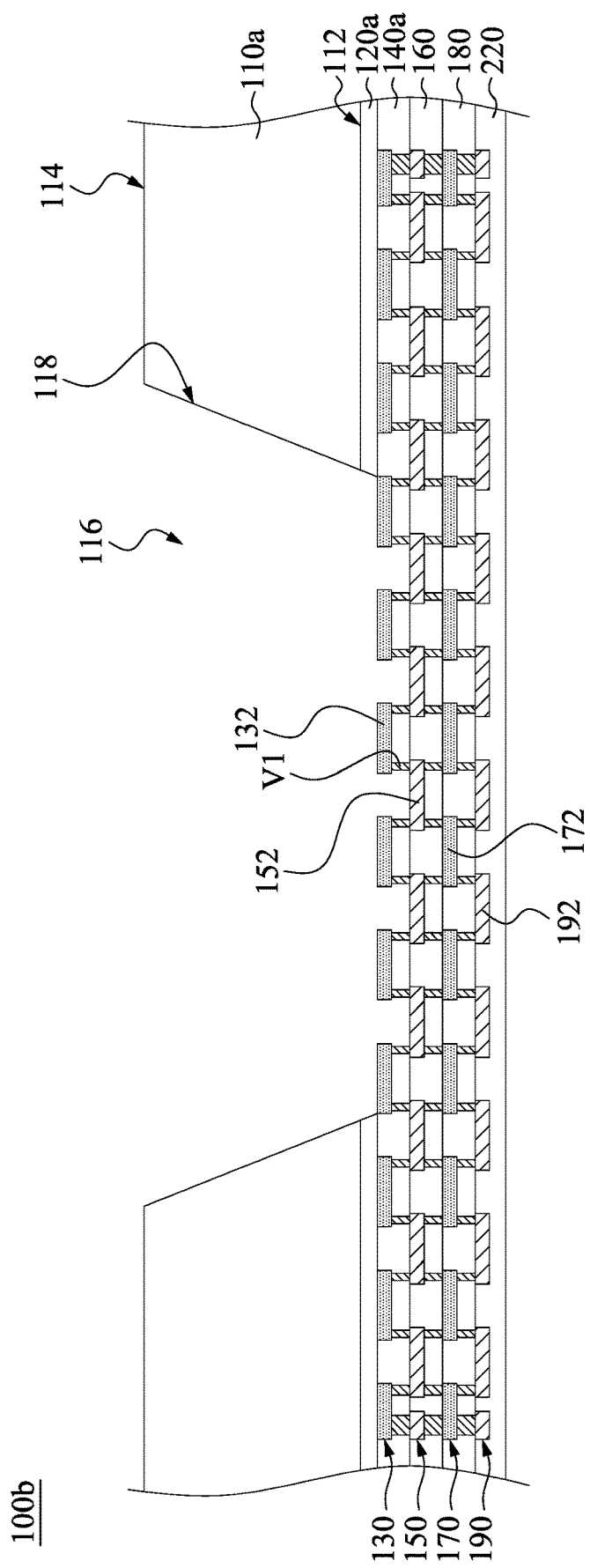
FIG. 9 is a cross-sectional view of a chip package according to one embodiment of the present invention, in which the cross-sectional position is the same as in FIG. 7.

FIG. 9 is a cross-sectional view of a chip package 100b according to one embodiment of the present invention, in which the cross-sectional position is the same as in FIG. 7. The chip package 100b includes the substrate 110a, the first dielectric layer 120a, the first metal layer 130, a second dielectric layer 140a, the second metal layer 150, and the first conductive vias V1. The difference between this embodiment and the embodiment shown in FIG. 7 is that the through hole 116 of the substrate 110a has no second dielectric layer 140a therein, and the second sections 152 of the second metal layer 150 are located in the through hole 116 to be exposed. The structure of the chip package 100b of FIG. 9 may be formed by etching the second dielectric layer 140 of FIG. 7. However, in some embodiment, when the first dielectric layer 120a of FIG. 7 is etched, the second dielectric layer 140 in the through hole 116 of FIG. 7 may be removed simultaneously, thereby obtaining the second dielectric layer 140a of FIG. 9. The second sections 152 of the second metal layer 150 may be act as an etch stop layer for the aforementioned etch step to prevent other underlying dielectric layers (e.g., the third dielectric layer 160) from suffering the aforesaid etch step to form a recess. Therefore, a bending angle of the subsequently formed redistribution layer can be prevented from being too large to break.

Figure 10:
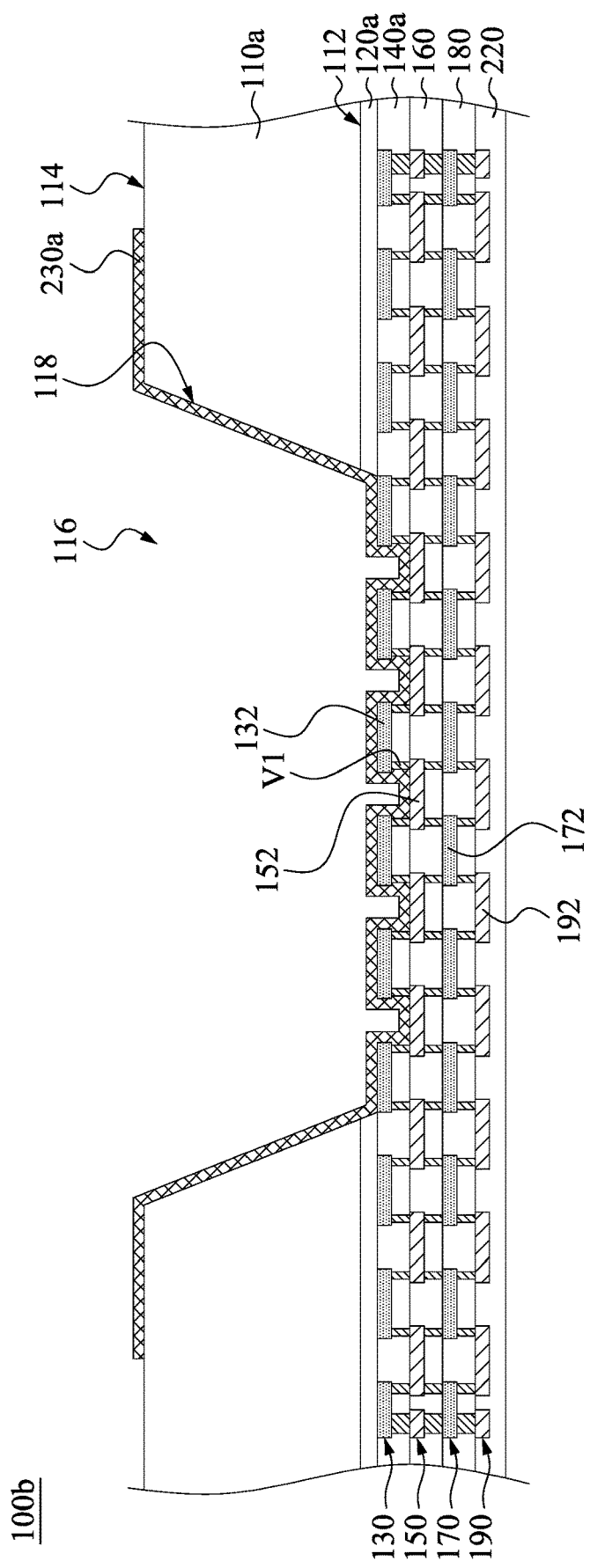
FIG. 10 is a cross-sectional view of the chip package of FIG. 9 after forming a redistribution layer.

FIG. 10 is a cross-sectional view of the chip package 100b of FIG. 9 after forming a redistribution layer 230a. The chip package 100b further includes the redistribution layer 230a. The redistribution layer 230a is not only located on the upper surface 114 of the substrate 110a, the wall surface 118 of the through hole 116, and the first sections 132 in the through hole 116, but also extends onto the second sections 152 in the through hole 116. Therefore, through the first sections 132 of the first metal layer 130 and the second sections 152 of the second metal layer 150, the redistribution layer 230a can be electrically connected to other metal layers, such as the third metal layer 170. In this embodiment, the redistribution layer 230a is in electrical contact with both of the first and second sections 132 and 152, and thus a contact area between the redistribution layer 230a and the metal layers (i.e., the first and second metal layers 130 and 150) is increased to improve the stability of the redistribution layer 230a, thereby improving the yield of products.

The redistribution layer 230a may be formed by sputtering. The second sections 152 of the second metal layer 150 may serve as an etch stop layer of the aforesaid etch step to prevent other underlying dielectric layers (e.g., the third dielectric layer 160) from suffering the aforesaid etch step to form a recess, such that an aspect ratio of a TSV is reduced. Therefore, a bending angle of the redistribution layer 230a can be prevented from being too large to break, and a process window of sputtering can be expanded.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A chip package, comprising:
   a substrate;
   a first dielectric layer located on a lower surface of the substrate;
   a first metal layer located on a lower surface of the first dielectric layer and having a plurality of first sections, wherein every two adjacent first sections have a gap therebetween;
   a second dielectric layer located on a lower surface of the first metal layer and the lower surface of the first dielectric layer;
   a second metal layer located on a lower surface of the second dielectric layer and having a plurality of second sections, wherein the second sections are respectively aligned with the gaps, and two sides of each of the second sections respectively overlap two adjacent first sections;
   a plurality of first conductive vias located in the second dielectric layer, wherein each of the first conductive vias is in electrical contact with one of the first sections and one of the second sections; and
   a redistribution layer extending from an upper surface of the substrate to the second sections of the second metal layer, wherein the redistribution layer is in direct contact with the first sections of the first metal layer, the first conductive vias, and the second sections of the second metal layer.

2. The chip package of claim 1, wherein a width of the second sections is greater than a width of the gaps.

3. The chip package of claim 1, wherein the first sections, the second sections, and the first conductive vias extend along a same direction.

4. The chip package of claim 1, wherein the first sections are parallel to the second sections.

5. The chip package of claim 1, wherein the substrate has a through hole that has no first dielectric layer therein, and the first sections are located in the through hole.

6. The chip package of claim 5, wherein the redistribution layer is in direct contact with the upper surface of the substrate and a wall surface of the through hole.

7. The chip package of claim 6, wherein the through hole has no second dielectric layer therein, the second sections are located in the through hole, and the redistribution layer extends onto the top surfaces of the second sections in the through hole.

8. The chip package of claim 1, further comprising:
   a third dielectric layer located on a lower surface of the second metal layer and the lower surface of the second dielectric layer.

9. The chip package of claim 8, further comprising:
   a third metal layer located on a lower surface of the third dielectric layer and having a plurality of third sections, wherein the third sections are respectively aligned with the first sections, and two sides of each of the third sections respectively overlap two adjacent second sections.

10. The chip package of claim 9, further comprising:
    a plurality of second conductive vias located in the third dielectric layer, wherein each of the second conductive vias is in electrical contact with one of the second sections and one of the third sections.

11. The chip package of claim 9, further comprising:
    a fourth dielectric layer located on a lower surface of the third metal layer and the lower surface of the third dielectric layer.

12. The chip package of claim 11, further comprising:
    a fourth metal layer located on a lower surface of the fourth dielectric layer and having a plurality of fourth sections, wherein the fourth sections are respectively aligned with the second sections, and two sides of each of the fourth sections respectively overlap two adjacent third sections.

13. The chip package of claim 12, further comprising:
    a plurality of third conductive vias located in the fourth dielectric layer, wherein each of the third conductive vias is in electrical contact with one of the third sections and one of the fourth sections.

14. The chip package of claim 12, wherein a width of the fourth sections is the same as a width of the second sections.

15. The chip package of claim 12, further comprising:
    a fifth dielectric layer located on a lower surface of the fourth metal layer and the lower surface of the fourth dielectric layer.

16. The chip package of claim 9, wherein a width of the third sections is the same as a width of the first sections.

* * * * *